United States Patent
Shiono et al.

[19]

[11] Patent Number: 5,997,704
[45] Date of Patent: Dec. 7, 1999

[54] SPUTTERING TARGET FOR DEPOSITING FERROELECTRIC FILM, METHOD FOR PREPARING THE SAME, AND METHOD FOR PREPARING A DRAM USING THE SAME

[75] Inventors: Ichirou Shiono; Kazuo Watanabe; Hitoshi Maruyama; Akifumi Mishima, all of Omiya; Satoru Mori; Jun-ichi Oda, both of Sanda, all of Japan

[73] Assignee: Mitsubishi Materials Corporation, Tokyo, Japan

[21] Appl. No.: 08/962,678

[22] Filed: Nov. 3, 1997

[30] Foreign Application Priority Data

Nov. 1, 1996 [JP] Japan .................................. 8-291776
May 2, 1997 [JP] Japan .................................. 9-114614

[51] Int. Cl.$^6$ ............................. C23C 14/00; B24B 1/00; B24B 7/30
[52] U.S. Cl. ............................. 204/298.12; 204/298.13; 451/48; 438/3
[58] Field of Search ................... 204/298.13, 298.12; 420/417, 580; 148/421, 442; 451/48; 438/3

[56] References Cited

U.S. PATENT DOCUMENTS 4,834,860 5/1989 Demaray et al. .................... 204/298
5,709,783 1/1998 Sanchez et al. .................... 204/192.18

FOREIGN PATENT DOCUMENTS 6-264231 9/1994 Japan .
7-109566 4/1995 Japan .
8-3736 1/1996 Japan .

*Primary Examiner*—Yogendra Gupta
*Assistant Examiner*—Brian P. Mruk
*Attorney, Agent, or Firm*—Oblon, Spivak, McClelland, Maier & Neustadt, P.C.

[57] ABSTRACT

The present invention provides sputtering targets which are useful for depositing ferroelectric films and are resistant to crack generation during sputtering. The sputtering targets comprise a disk target which is formed using a sintered material including a compound oxide of Ba and Ti, Sr and Ti, or Ba, Sr and Ti, and which has a surface which has been subjected to grinding, wherein the scratches 4 formed on the surface of the disk target due to grinding have a pattern radiating from an arbitrary point on the plane of the surface of said disk target.

23 Claims, 9 Drawing Sheets

SPUTTERING TARGET FOR DEPOSITING FERROELECTRIC FILM, METHOD FOR PREPARING THE SAME, AND METHOD FOR PREPARING A DRAM USING THE SAME

BACKGROUND OF THE INVENTION

1. Field of the Invention

The present invention relates to sputtering targets which are useful for depositing ferroelectric films and which are free of crack generation even when used to deposit a thin film for a DRAM or the like containing a ferroelectric oxide having the perovskite structure.

2. Discussion of the Background

As is well-known, a sputtering target composed of a sintered material including a compound oxide of Ba and Ti (hereinafter referred to as BaTi compound oxide), a compound oxide of Sr and Ti (hereinafter referred to as SrTi compound oxide), or a compound oxide of Ba, Sr and Ti (hereinafter referred to as BaSrTi compound oxide) is generally used to form a memory-retaining capacitor thin film for a dynamic random access memory (DRAM). Further, it is also well-known that any ferroelectric film which is formed of a BaTi, SrTi, or BaSrTi compound oxide by sputtering such a target has the perovskite structure, and that particularly a sputtering target composed of a BaSrTi compound oxide is most widely used to form a memory-retaining capacitor thin film for a DRAM.

A sputtering target composed of a sintered material including such a BaTi, SrTi, or BaSrTi compound oxide is manufactured as follows. Initially, a $BaCO_3$ powder, a $SrCO_3$ powder, and/or a $TiO_2$ powder are prepared as raw-material powders, and then blended in a predetermined ratio and mixed in a ball mill. Next, the obtained powder mixture is placed in a MgO pot and burned in air at 1200 to 1350° C. for 3 to 10 hours. Subsequently, the burned material is crushed using a ball mill to form a BaTi, SrTi, or BaSrTi compound oxide powder. Here, such a compound oxide powder can also be prepared according to hydrothermal synthesis, or can be commercially obtained.

Next, the obtained BaTi, SrTi, or BaSrTi compound oxide powder is subjected to burning and crushing under the same conditions as above further two times or more, and then hot-pressed in a vacuum of $1 \times 10^{-4}$ to $5 \times 10^{-2}$ Torr under a load of 50 to 200 $kg/cm^2$ at 900 to 1300° C. for 0.5 to 3 hours. The thus-prepared sintered material of the BaTi, SrTi, or BaSrTi compound oxide is then processed by grinding into a target having a predetermined size.

As shown in FIG. 12, such a process for grinding a sintered material of a BaTi, SrTi, or BaSrTi compound oxide is usually carried out by placing a rotating straight grinding wheel 2' into perpendicular contact with the surface of the sintered material which is horizontally rotated on a grinding table 3, and moving the rotating straight grinding wheel 2' in the direction of the radius of the grinding table. Scratches 4' due to grinding (grinding scratches) are formed in concentric circles on the surface of the thus-obtained conventional target 1' by such grinding.

As shown in FIG. 10, the obtained target is set in a sputtering system 6 by being soldered onto a water-cooled copper plate 5 and subjected to sputtering under the condition that the region of the system for the target is adjusted to a vacuum atmosphere, thus depositing a ferroelectric film.

Recently, for mass production of DRAMs or the like and for saving the costs of producing the same, a larger target is used and sputtered with a greater power under a high-vacuum atmosphere thereby achieving a high deposition rate, and thus depositing a ferroelectric film in a shorter time. Such a target may, however, suffer damage such as peeling of the surface or cracking when subjected to sputtering with a greater power under a high-vacuum atmosphere. If the target is thus damaged, particles are generated on the obtained thin film, seriously affecting the yield of DRAMs. Thus, there remains a need for a sputtering target which is useful for depositing a ferroelectric film and does not suffer from cracking during sputtering. There also remains a need for a method for preparing such a sputtering target and a method for preparing a DRAM using such a target.

SUMMARY OF THE INVENTION

Accordingly, it is one object of the present invention to provide novel sputtering targets which comprise sintered material of a BaTi compound oxide, a SrTi compound oxide, or a BaSrTi compound oxide and which exhibit a reduced tendency to undergo cracking during sputtering.

It is another object of the present invention to provide a novel method for preparing such a sputtering target.

It is another object of the present invention to provide a novel method for preparing a DRAM using such a sputtering target.

To achieve these objectives, the Inventors conducted an investigation to develop a sputtering target for depositing a ferroelectric film, the target being free of crack generation during sputtering and set in a sputtering system by being soldered onto a water-cooled copper plate. As a result, they found that the grinding scratches formed on the surface of the disk target greatly influence the crack generation in the target during sputtering.

More specifically, the Inventors obtained, for example, the following findings.

(a) In general, when a target is set in a sputtering system by being soldered onto a water-cooled copper plate and sputtered in a vacuum atmosphere, since the region where the target is placed is decompressed while the region where the water-cooled copper plate is situated is in air, the target is bent and deformed by the atmospheric pressure as indicated by the dotted lines in FIG. 10, and such bending deformation generates a tensile stress A on the surface of the target in the direction of the radius of the target as indicated by the double-headed arrow.

(b) When a conventional target 1' having concentrically circular grinding scratches 4' as shown in FIG. 11 is bent and deformed as indicated by the dotted lines in FIG. 10, since the grinding scratches 4' are formed perpendicular to the tensile stress A, small cracks are generated from the grinding scratches 4' and grow into large cracks causing breakage.

(c) Accordingly, if the grinding scratches formed on the surface of the target have a pattern radiating from the center of the target toward its periphery, such as the grinding scratches 4 shown in FIG. 1 or 2, cracks are not generated in the target during sputtering.

(d) Although the most suitable position for the starting point P of the radial pattern of the grinding scratches 4 is the center of the disk target, as shown in FIGS. 1 and 2, it may be an arbitrary point situated on the surface of the disk target and distant from the center of the disk target, as shown in FIGS. 3 and 4.

(e) Further, even if the grinding scratches 4 are in a pattern radiating from an arbitrary point P' which is situated on the plane defined by the surface of the disk target but is distant from the surface of the disk target as shown in FIGS. 5, 6, and 7, generation of cracks in the target during sputtering can be prevented since the percentage of grinding scratches 4' concentrically circular with respect to the center of the disk target is extremely small. The dotted lines in FIGS. 5, 6, and 7 are imaginary grinding scratches in a pattern radiating from P', and are additionally shown for ease of comprehending the radial pattern of the actual grinding scratches.

(f) The sputtering target to deposit a ferroelectric film may have grinding scratches forming a plurality of radial patterns starting at a plurality of arbitrary points. For example, as shown in FIG. 8, the grinding scratches 4 may form two radial patterns starting at two arbitrary points P1 and P2 on the plane of the surface of the disk target.

The present invention has been accomplished on the basis of the above-described findings. Thus, according to a first aspect of the present invention, there is provided:

(1) A high-density sputtering target to deposit a ferroelectric film, said target comprising a disk target which is formed using a sintered material including a BaTi compound oxide, a SrTi compound oxide, or a BaSrTi compound oxide, and which has a surface which has been subjected to grinding, wherein the scratches formed on the surface of said disk target due to grinding have a pattern radiating from an arbitrary point on the plane defined by the surface of said disk target;

(2) The high-density sputtering target to deposit a ferroelectric film according to the above paragraph (1), wherein the arbitrary point is situated on the surface of the disk target;

(3) The high-density sputtering target to deposit a ferroelectric film according to the above paragraph (1), wherein said arbitrary point is situated on the plane defined by the surface of said disk target, but is not situated on the surface of said disk target; and (4) The high-density sputtering target to deposit a ferroelectric film according to the above paragraph (1), wherein said arbitrary point is the center of the surface of said disk target.

The arbitrary point on the plane defined by the surface of the disk target as a starting point of the radial pattern formed by the grinding scratches should preferably be situated close to the center of the disk target. Accordingly and more specifically, the arbitrary point should preferably be situated in a circular area at the center of the disk target which has a radius half that of the disk target or less. More preferably, the arbitrary point should be situated in a circular area at the center of the disk target which has a radius one-quarter that of the disk target or less.

Moreover, the grinding scratches forming a pattern radiating from an arbitrary point on the plane defined by the surface of the target should preferably be finer. According to another aspect of the present invention, therefore, there is provided:

(5) A sputtering target to deposit a ferroelectric film, the target comprising a disk target which is formed using a sintered material including a BaTi compound oxide, a SrTi compound oxide, or a BaSrTi compound oxide, and which has a surface which has been subjected to grinding, wherein the scratches formed on the surface of the disk target due to grinding have a pattern radiating from an arbitrary point on the plane defined by the surface of the disk target, and the maximum surface roughness $R_{max}$ owing to the scratches is 5 μm or less, preferably 4 μm or less.

(6) The high-density sputtering target to deposit a ferroelectric film according to the above paragraph (5), wherein the arbitrary point is situated on the surface of the disk target;

(7) The high-density sputtering target to deposit a ferroelectric film according to the above paragraph (5), wherein said arbitrary point is situated on the plane defined by the surface of said disk target, but is not situated on the surface of said disk target; and (8) The high-density sputtering target to deposit a ferroelectric film according to the above paragraph (5), wherein said arbitrary point is the center of the surface of said disk target.

Furthermore, when the sputtering target to deposit a ferroelectric film according to the present invention, the sputtering target having grinding scratches which form a pattern radiating from an arbitrary point on the plane defined by the surface of the target, has a higher density, the target exhibits a higher strength, an improved tolerance against bending and deformation, and a tolerance against the tensile stress satisfactory for inhibiting the growth of small cracks. Due to this, cracking does not occur during sputtering. According to another aspect of the present invention, therefore, there is further provided:

(9) A sputtering target to deposit a ferroelectric film, the target comprising a disk target which has a relative density of 95% or higher, preferably 97 to 99%, is formed using a sintered material including a BaTi compound oxide, a SrTi compound oxide, or a BaSrTi compound oxide, and has a surface which has been subjected to grinding, wherein the scratches formed on the surface of the disk target due to grinding have a pattern radiating from an arbitrary point on the plane defined by the surface of the disk target, and the maximum surface roughness $R_{max}$ owing to the scratches is 5 μm or less, preferably 4 μm or less.

(10) The high-density sputtering target to deposit a ferroelectric film according to the above paragraph (9), wherein the arbitrary point is situated on the surface of the disk target;

(11) The high-density sputtering target to deposit a ferroelectric film according to the above paragraph (9), wherein said arbitrary point is situated on the plane defined by the surface of said disk target, but is not situated on the surface of said disk target; and

(12) The high-density sputtering target to deposit a ferroelectric film according to the above paragraph (9), wherein said arbitrary point is the center of the surface of said disk target.

BRIEF DESCRIPTION OF THE DRAWINGS

A more complete appreciation of the invention and many of the attendant advantages will be readily obtained as the invention becomes better understood by reference to the following detailed description when considered in connection with the accompanying drawings in which like reference characters designate like or corresponding parts and wherein.

Figure 1:
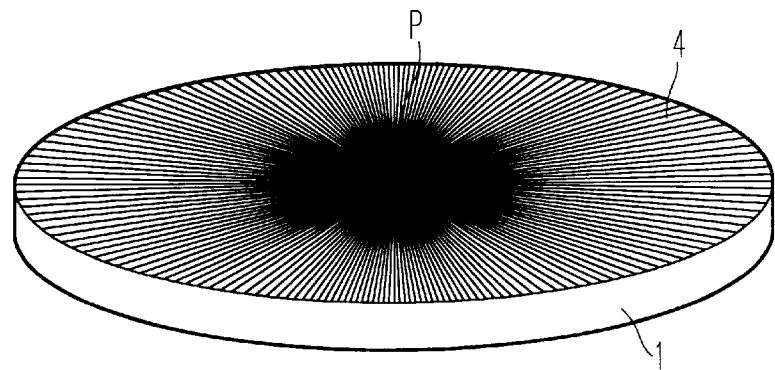
FIG. 1 is a perspective view of a sputtering target according to the present invention.

In the drawings, the reference characters have the following meanings:

1: target
1': target
2: straight cup wheel
2': straight grinding wheel
3: grinding table
4: grinding scratch
4': grinding scratch
5: cooled copper plate
6: sputtering system
P: arbitrary point
P': arbitrary point
P1: arbitrary point
P2: arbitrary point

DETAILED DESCRIPTION OF THE PREFERRED EMBODIMENTS

Most suitably, the sputtering target of the present invention for depositing a ferroelectric film has grinding scratches 4 radiating in the radial directions as shown in FIG. 1. Such a sputtering target having such grinding scratches 4 can be manufactured by grinding in a radial direction a sintered material including a BaTi, SrTi, or BaSrTi compound oxide which can be prepared according to the above-described conventional process.

The process of grinding a sintered material in its radial direction, however, requires considerable time and cost. In order to solve these problems, a method has been conceived in which the sintered material placed on a grinding table 3 is slowly rotated while a straight cup wheel 2 horizontally rotatable as shown in FIG. 9 is put into contact with the sintered material such that the wheel passes through the central portion of the sintered material. According to this method, grinding scratches 4 radiating from the center toward the periphery are formed on the surface of the target, as shown in FIGS. 2, 3, 4, 5, 6, or 8. In such a case, the larger the diameter of the straight cup wheel 2 is, the closer to radial directions the grinding scratches are formed, namely, the grinding scratches are formed more similar to straight lines.

Figure 13:
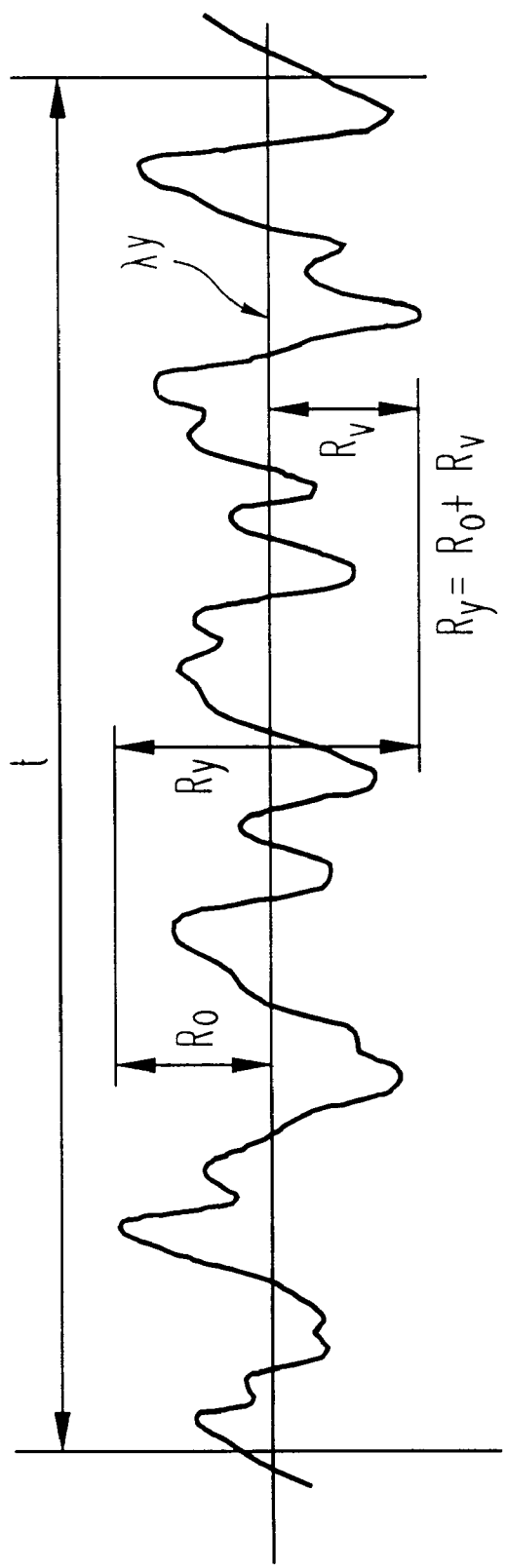
FIG. 13 graphically shows the measurement of $R_{max}$ ($R_y$).

In the context of the present invention, $R_{max}$ means maximum height. It also denoted as $R_y$ and may be measured as described in JIS B 0601-1994. Specifically, a reference length is extracted from the roughness curve in direction of the mean line. The interval between the peak line and the valley line of this extracted part is measured in the direction of longitudinal magnification. This value is indicated in micrometers ($\mu$m) (see FIG. 13). (Note: To obtain $R_y$, the reference length should be extracted from a part where there are no extremely high peaks or extremely low valleys which may be considered a defect.

The relative density is measured as follows. Using a JCPDS card (39-1395), the grating constant is obtained by X-ray diffraction. In this manner, the volume per unit cell can be obtained. Furthermore, the atomic count contained in this unit cell is obtained. This atomic count is multiplied by the atomic weight, then divided by the aforementioned volume to obtain the theoretical density (Dth in g/cm$^3$). With regard to the sample measurement, the sample is first weighed in air, then weighed in water. The volume of the sample is obtained by subtracting the latter from the former. By dividing the weight in air by the volume, the density (Dm in g/cm$^3$) of the sample is obtained. The relative density is then expressed as a percentage based on the following formula:

Relative Density=(Dth/Dm)×100 (%)

The present sputtering targets are particularly useful to prepare dynamic random access memories (DRAMs).

Having generally described this invention, a further understanding can be obtained by reference to certain specific examples which are provided herein for purposes of illustration only and are not intended to be limiting unless otherwise specified.

EXAMPLES

Several compound oxide powders were prepared, each including a commercially available BaTiO$_3$ powder, SrTiO$_3$ powder, (Ba$_{0.75}$,Sr$_{0.25}$)TiO$_3$ powder, (Ba$_{0.5}$,Sr$_{0.5}$)TiO$_3$ powder or (Ba$_{0.25}$,Sr$_{0.75}$)TiO$_3$ powder which was manufactured according to hydrothermal synthesis and had an average particle diameter of 0.3 $\mu$m. The compound oxide powders were individually packed in highly-pure-graphite molds having an inner diameter of 305 mm, and vacuum-hot-pressed under the below described conditions to form hot-pressed sintered materials which had a diameter of 305 mm and a thickness of 6 mm, and respectively had relative densities shown in Tables 1 and 2.

Temperature-Increasing Rate: 5° C./min
Heating Temperature: 1250° C.
Pressure: 50 to 200 Kgf/cm$^2$
Heating Time: 3 hours
Cooling Method: Furnace Cooling These hot-pressed sintered materials were ground using different grinding wheels to form the sputtering targets 1 to 20 according to the present invention (hereinafter referred to as targets of the present invention) and the comparative sputtering targets 1 to 5 (hereinafter referred to as comparative targets). Each of the targets 1 to 20 of the present invention and the comparative targets 1 to 5 had a diameter of 300 mm and a thickness of 5 mm, and exhibited a pattern of the grinding scratches shown in any one of FIGS. 1 to 8. Further, each target was subjected to measurements of the relative density and the maximum surface roughness $R_{max}$ owing to the grinding scratches, and the results are shown in Tables 1 to 3.

Figure 12:
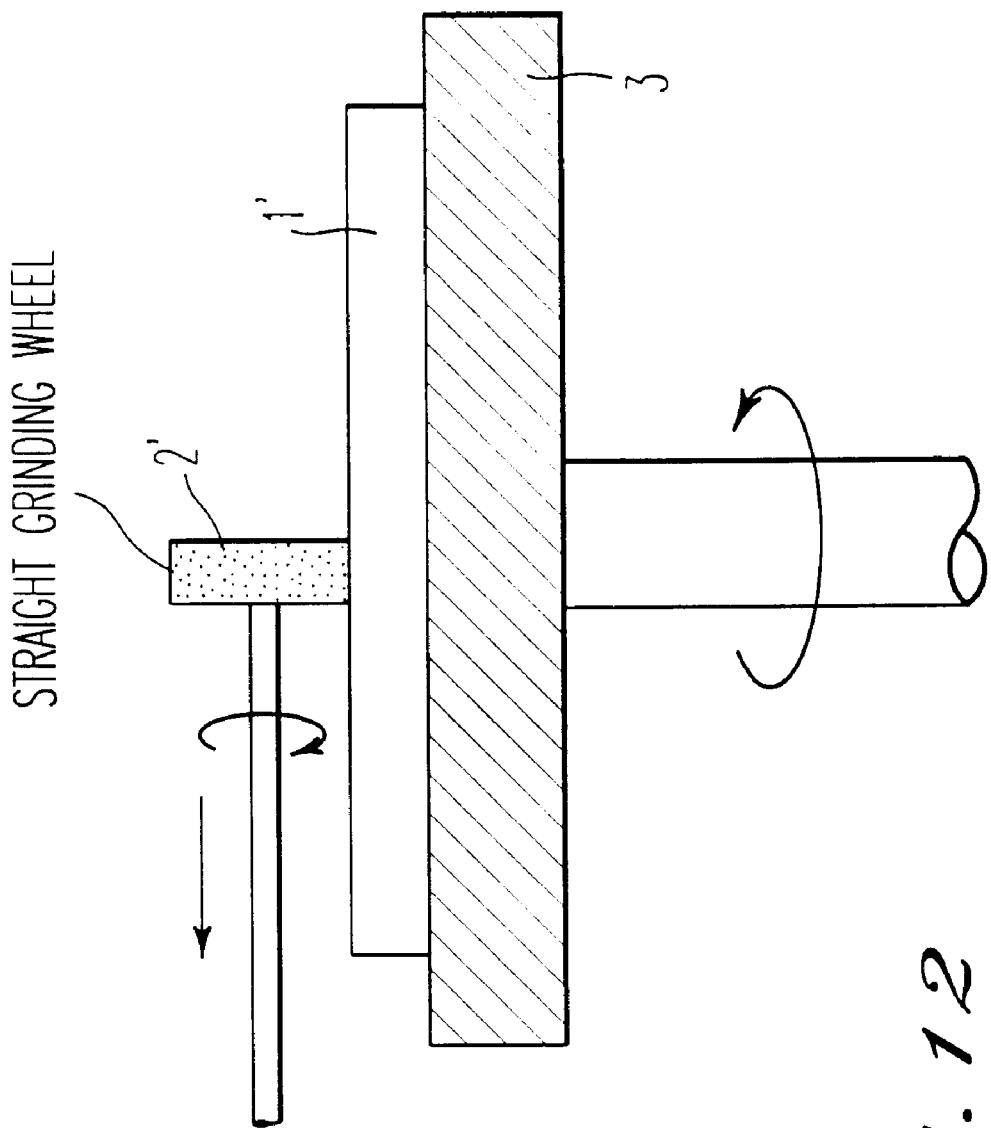
FIG. 12 is a sectional view illustrating the grinding process to manufacture a conventional sputtering target.

Meanwhile, hot-pressed sintered materials each having a relative density shown in Table 3 were ground to form conventional sputtering targets 1 to 4 (hereinafter referred to as conventional targets) having concentrically circular grinding-scratches. More specifically, as shown in FIG. 12, each sintered material was ground while it was horizontally rotated on a grinding table, and a rotating straight grinding wheel 2' which was kept in perpendicular contact with the surface of the sintered material was moved in a horizontal direction. The thus-obtained conventional targets were subjected to measurements of the relative density and the maximum surface roughness owing to the grinding scratches, and the results are shown in Table 3.

Each of the targets 1 to 20 of the present invention, the comparative targets 1 to 5, and the conventional targets 1 to 4 was soldered using an In-Sn solder onto a 18 mm thick copper disk plate for water cooling, set in a sputtering system, and sputtered under the following conditions.

Degree of Vacuum: 7.5 mTorr

Sputtering Gas: $Ar:O_2=4:1$

Applied Power: 13.56 MHZ, 1400 W (approximately 2 $W/cm^2$)

Discharging Time: 100 hours

In each target, the deposition rate was approximately 10 nm/min. After sputtering, each target was subjected to visual examination for whether or not cracks were generated. The results are shown in Tables 1 to 3.

TABLE 1

Figure 2:
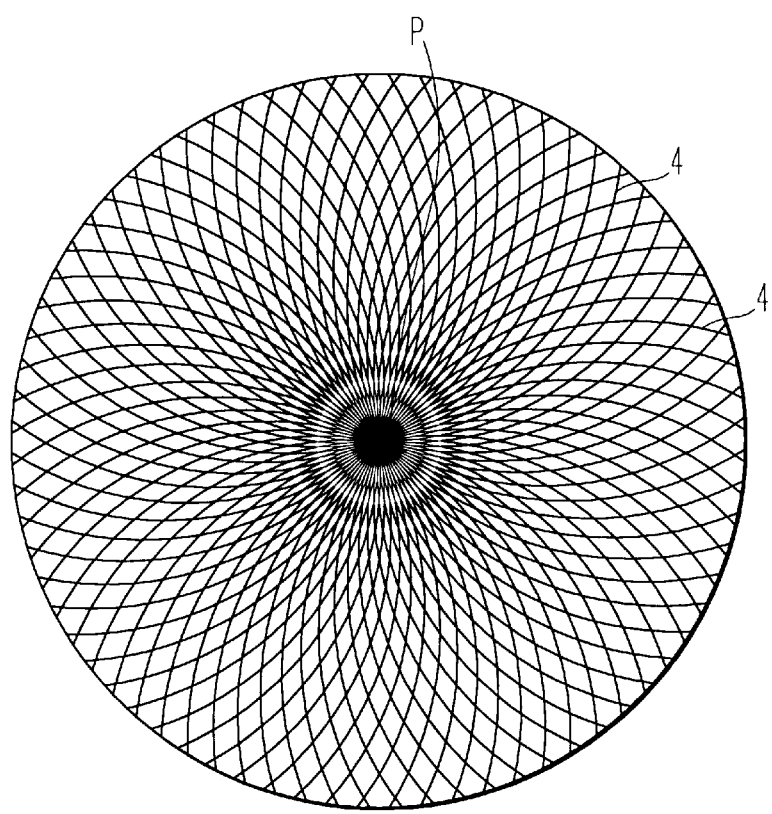
FIGS. 2 to 8 are plan views of sputtering targets according to the present invention.
Figure 3:
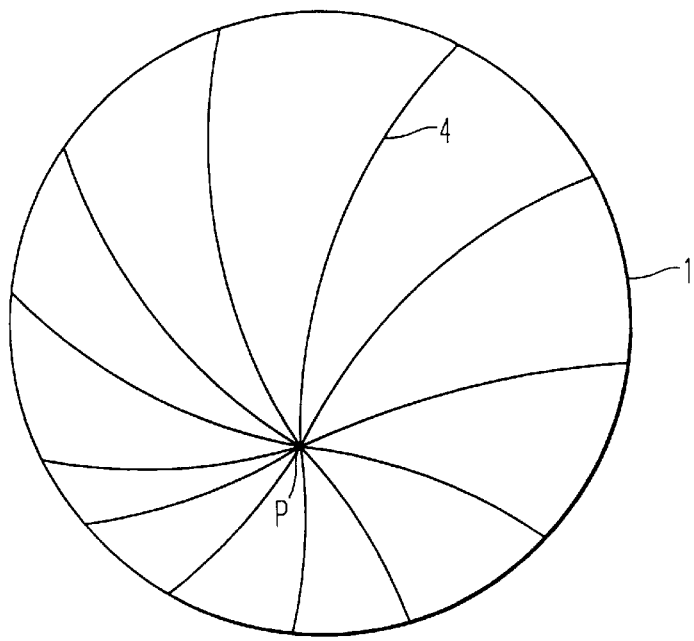
Figure 4:
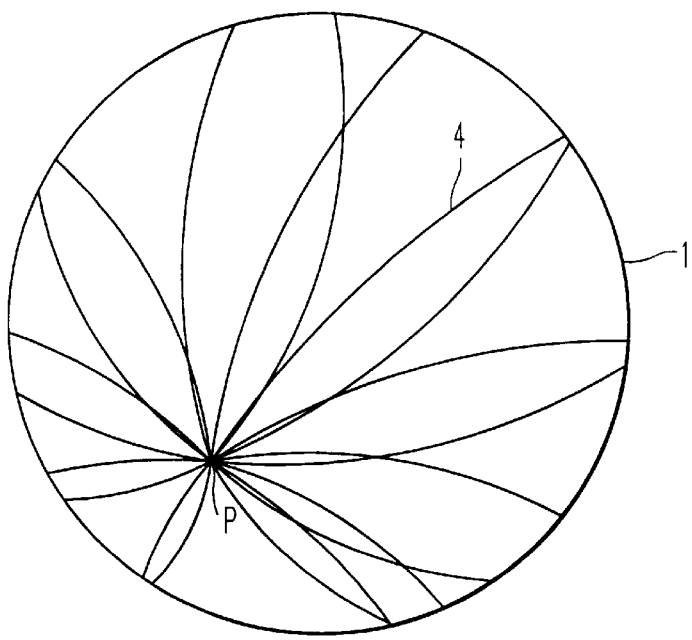
Figure 5:
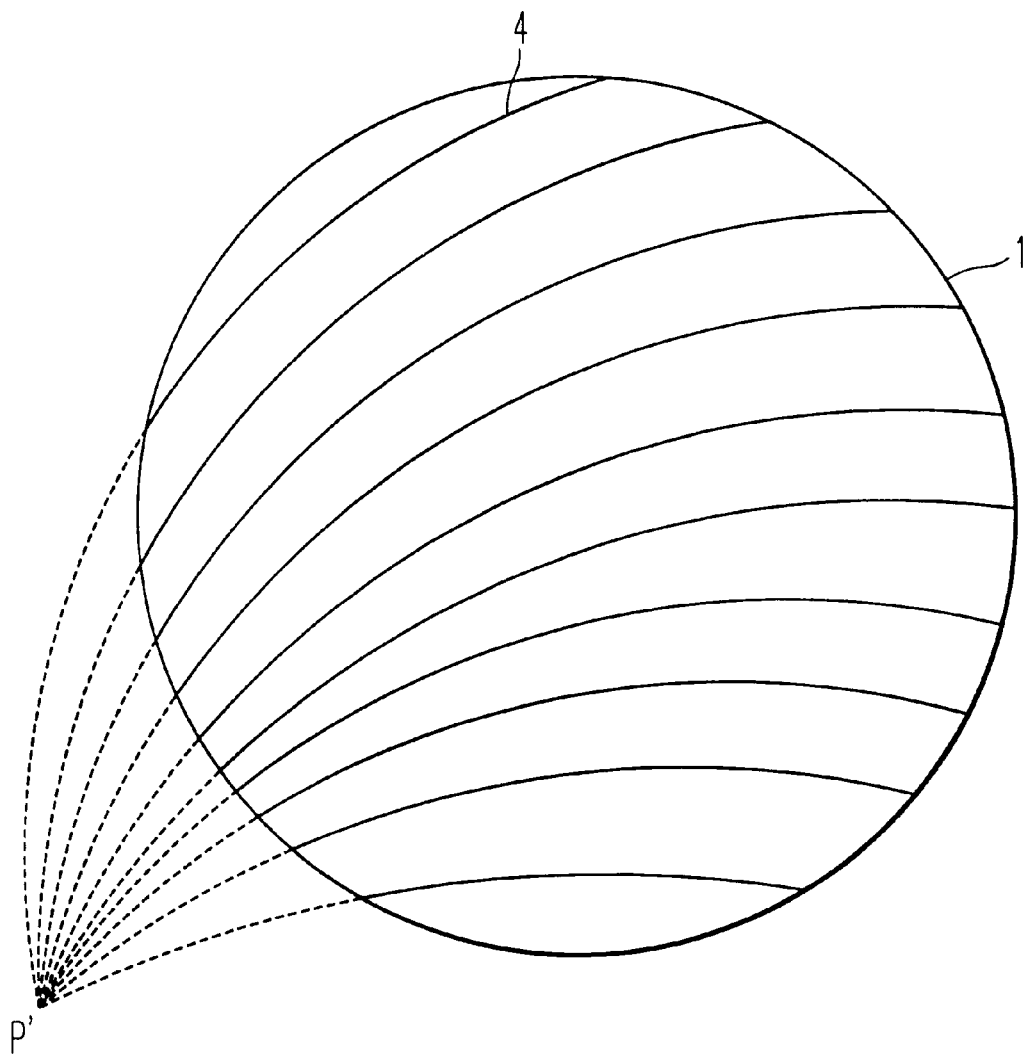
Figure 6:
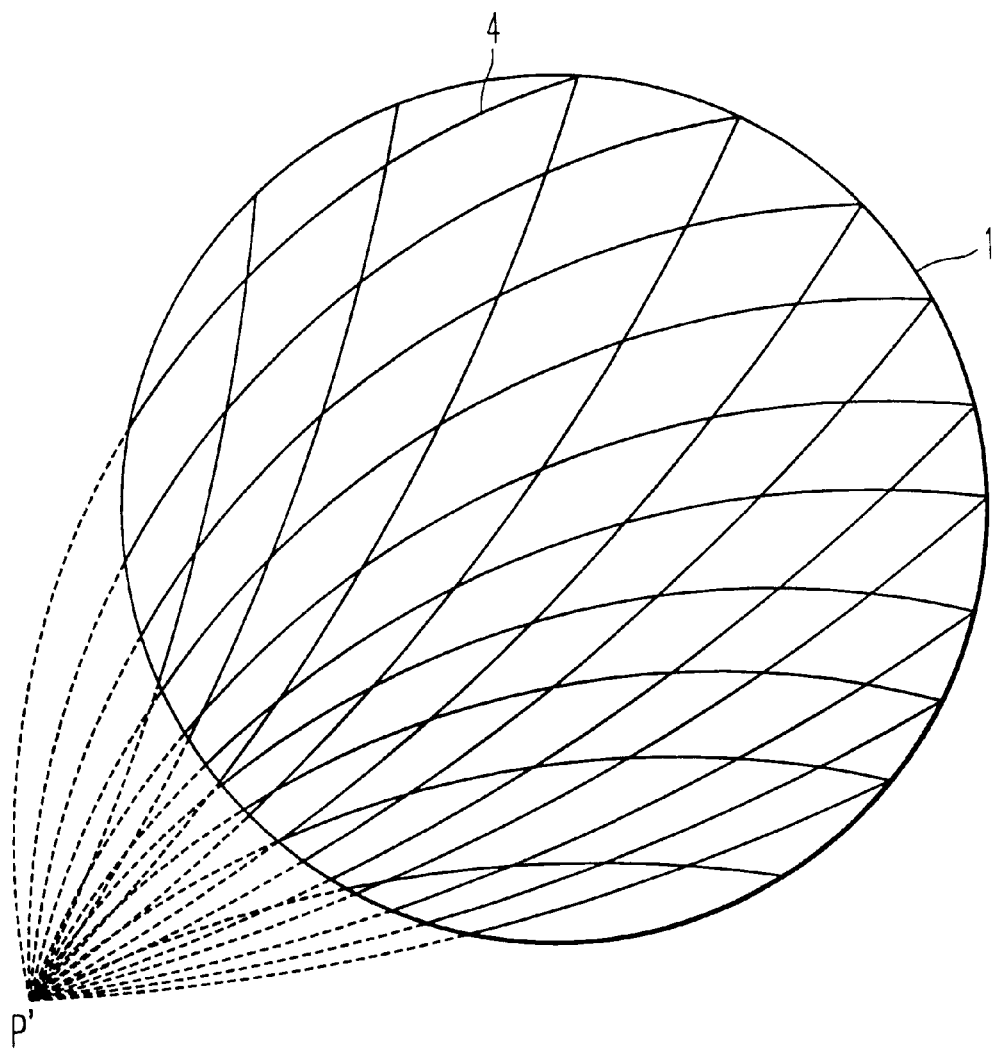
Figure 7:
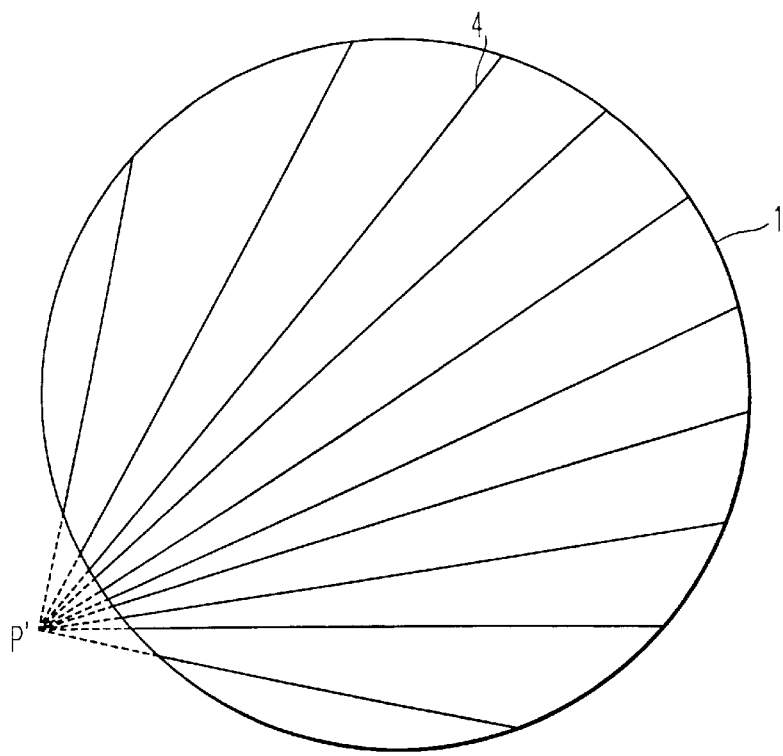
Figure 8:
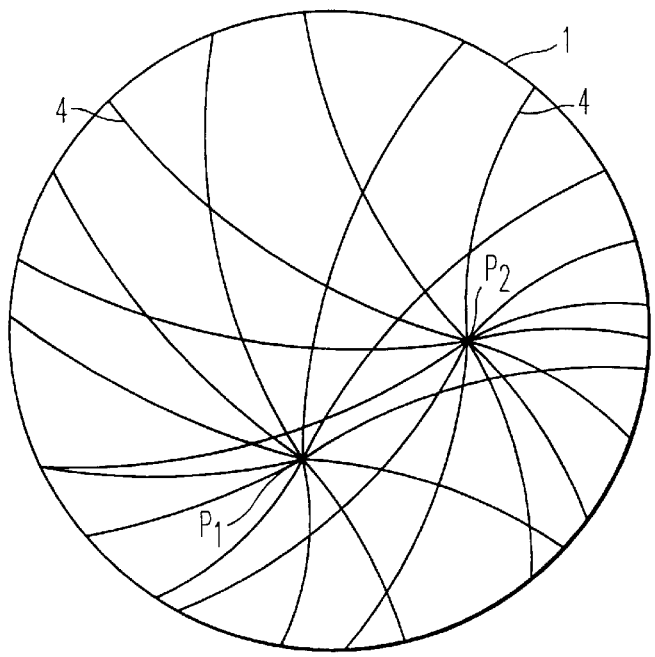
Figure 9:
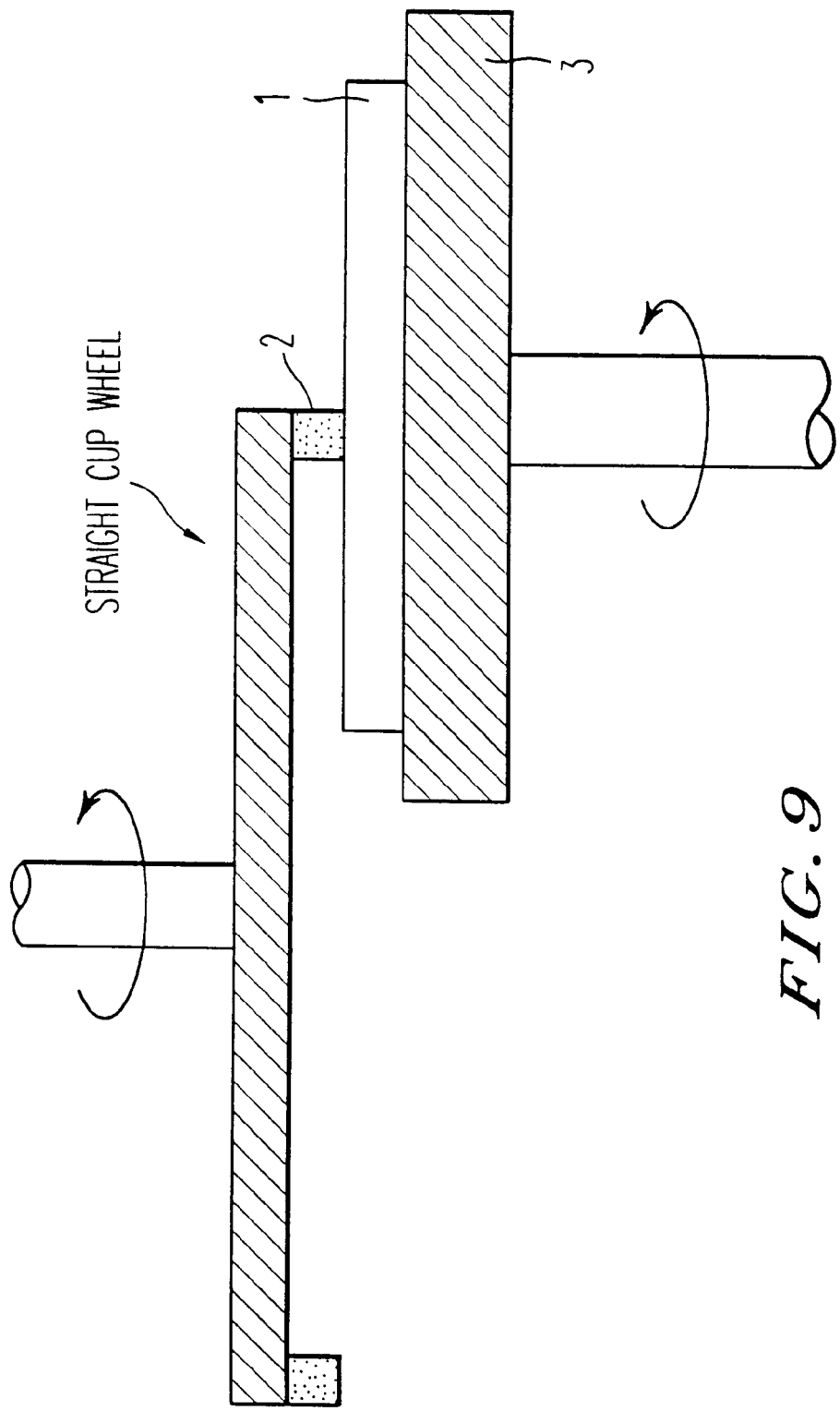
FIG. 9 is a sectional view illustrating the grinding process to manufacture a sputtering target of the present invention.
Figure 10:
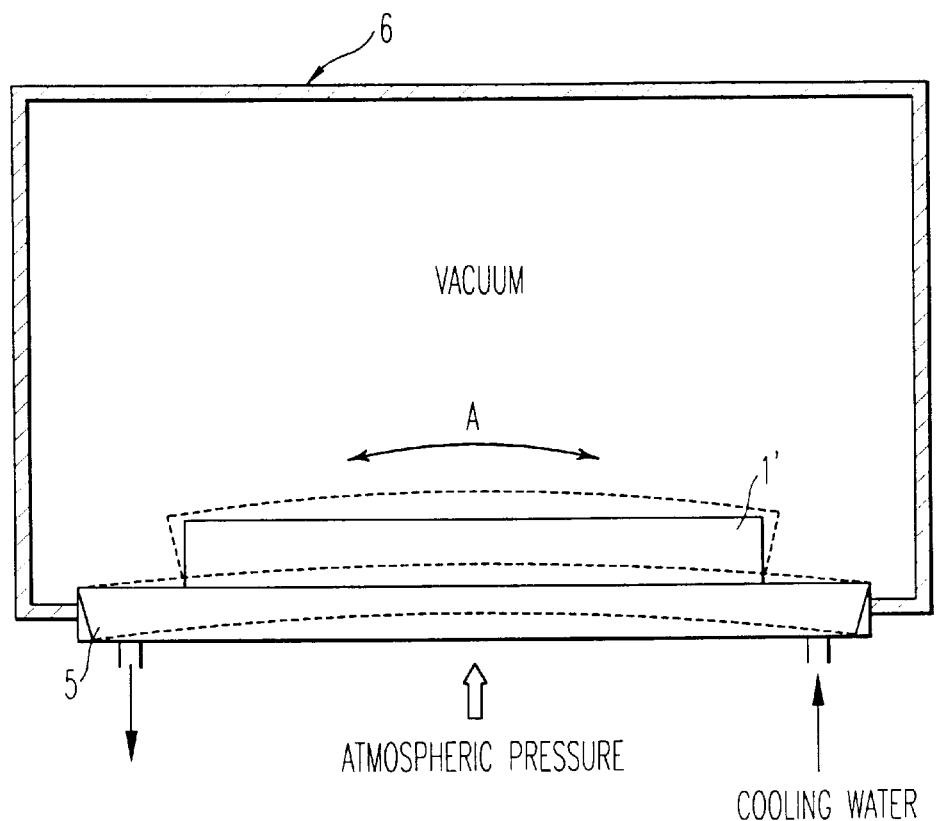
FIG. 10 is a schematic sectional view of a sputtering system for illustrating the problems in the conventional method.

| Target No. | Compound Oxide Composition of Target | Pattern of Grinding Scratches | Rmax Due to Grinding Scratches ($\mu$m) | Relative Density (%) | Cracks in Target After Sputtering |
|---|---|---|---|---|---|
| Targets of Present Invention | | | | | |
| 1 | $(Ba_{0.5}Sr_{0.5})TiO_3$ | FIG. 1 | 0.5 | 99 | None generated |
| 2 | $(Ba_{0.5}Sr_{0.5})TiO_3$ | FIG. 2 | 1.4 | 98 | None generated |
| 3 | $(Ba_{0.5}Sr_{0.5})TiO_3$ | FIG. 3 | 1.1 | 96 | None generated |
| 4 | $(Ba_{0.5}Sr_{0.5})TiO_3$ | FIG. 4 | 2.2 | 97 | None generated |
| 5 | $(Ba_{0.5}Sr_{0.5})TiO_3$ | FIG. 5 | 3.4 | 99 | None generated |
| 6 | $(Ba_{0.5}Sr_{0.5})TiO_3$ | FIG. 6 | 4.3 | 98 | None generated |
| 7 | $(Ba_{0.5}Sr_{0.5})TiO_3$ | FIG. 7 | 4.9 | 95 | None generated |
| 8 | $(Ba_{0.5}Sr_{0.5})TiO_3$ | FIG. 8 | 2.1 | 96 | None generated |
| 9 | $(Ba_{0.25}Sr_{0.75})TiO_3$ | FIG. 1 | 3.3 | 97 | None generated |
| 10 | $(Ba_{0.25}Sr_{0.75})TiO_3$ | FIG. 2 | 2.3 | 95 | None generated |

TABLE 2

| Target No. | Compound Oxide Composition of Target | Pattern of Grinding Scratches | Rmax Due to Grinding Scratches ($\mu$m) | Relative Density (%) | Cracks in Target After Sputtering |
|---|---|---|---|---|---|
| Targets of Present Invention | | | | | |
| 11 | $(Ba_{0.75}Sr_{0.25})TiO_3$ | FIG. 1 | 0.5 | 99 | None generated |
| 12 | $(Ba_{0.75}Sr_{0.25})TiO_3$ | FIG. 2 | 1.4 | 98 | None generated |
| 13 | $(Ba_{0.75}Sr_{0.25})TiO_3$ | FIG. 3 | 1.1 | 96 | None generated |
| 14 | $SrTiO_3$ | FIG. 4 | 2.2 | 97 | None generated |
| 15 | $BaTiO_3$ | FIG. 5 | 3.4 | 99 | None generated |
| 16 | $(Ba_{0.25}Sr_{0.25})TiO_3$ | FIG. 6 | 4.3 | 98 | None generated |
| 17 | $(Ba_{0.25}Sr_{0.75})TiO_3$ | FIG. 7 | 4.9 | 95 | None generated |
| 18 | $(Ba_{0.25}Sr_{0.75})TiO_3$ | FIG. 8 | 2.1 | 96 | None generated |
| 19 | $BaTiO_3$ | FIG. 1 | 3.3 | 97 | None generated |
| 20 | $SrTiO_3$ | FIG. 2 | 2.3 | 95 | None generated |

TABLE 3

Figure 11:
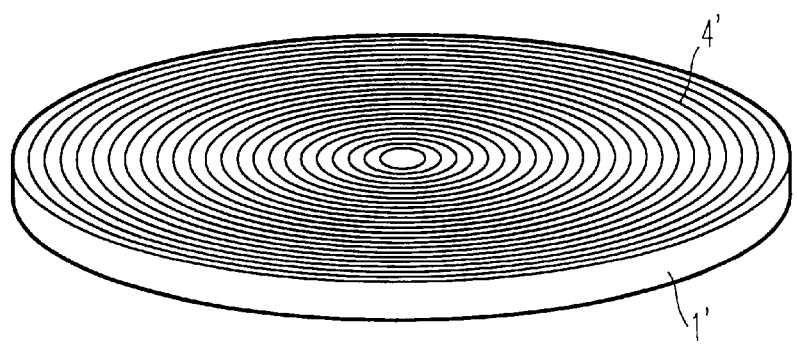
FIG. 11 is a perspective view of a conventional sputtering target.

| Target No. | Compound Oxide Composition of Target | Pattern of Grinding Scratches | Rmax Due to Grinding Scratches ($\mu$m) | Relative Density (%) | Cracks in Target After Sputtering |
|---|---|---|---|---|---|
| Comparative Targets | | | | | |
| 1 | $BaTiO_3$ | FIG. 1 | 8.6* | 99 | Generated |
| 2 | $(Ba_{0.75}Sr_{0.25})TiO_3$ | FIG. 2 | 8.3* | 98 | Generated |
| 3 | $(Ba_{0.5}Sr_{0.5})TiO_3$ | FIG. 3 | 7.1* | 96 | Generated |
| 4 | $(Ba_{0.25}Sr_{0.75})TiO_3$ | FIG. 4 | 8.2* | 97 | Generated |
| 5 | $SrTiO_3$ | FIG. 5 | 9.4* | 99 | Generated |
| Conventional Targets | | | | | |
| 1 | $(Ba_{0.75}Sr_{0.25})TiO_3$ | FIG. 11 | 1.4 | 94 | Generated |
| 2 | $(Ba_{0.5}Sr_{0.5})TiO_3$ | FIG. 11 | 1.1 | 96 | Generated |
| 3 | $(Ba_{0.25}Sr_{0.75})TiO_3$ | FIG. 11 | 2.2 | 97 | Generated |
| 4 | $SrTiO_3$ | FIG. 11 | 2.2 | 97 | Generated |

*Outside range of present invention.

As is obvious from the results shown in Tables 1 to 3, the targets 1 to 20 of the present invention, in each of which the surface of the disk target had grinding scratches radiating from an arbitrary point on the plane defined by the surface the target, and the maximum surface roughness $R_{max}$ owing to the grinding scratches was 5 μm or less, were free of crack generation during sputtering, in contrast to the conventional targets 1 to 4 having concentrically circular grinding scratches. Further, when the maximum surface roughness $R_{max}$ owing to the grinding scratches exceeds 5 μm as in the comparative targets 1 to 5, cracking inevitably occurs during sputtering.

As described above, since the sputtering target to deposit a ferroelectric film according to the present invention is free of crack generation during sputtering, particles are not generated in the obtained film, and therefore, the present invention is capable of greatly contributing to mass production of DRAMs or the like and to reducing the costs for producing them.

This application is based on Japanese Patent Applications Hei 8-291776 and Hei 9-114614, which are incorporated herein by reference in their entirety.

Obviously, numerous modifications and variations of the present invention are possible in light of the above teachings. It is therefore to be understood that, within the scope of the appended claims, the invention may be practiced otherwise than as specifically described herein.

What is claimed as new and is desired to be secured by Letters Patent of the United States is:

1. A sputtering target, which comprises a disk target, said disk target comprising a sintered material selected from the group consisting of a compound oxide of Ba and Ti, a compound oxide of Sr and Ti, and a compound oxide of Ba, Sr and Ti, said disk target having a surface, said surface defining a plane, and said surface having grooves, wherein said grooves form a pattern intersecting at an arbitrary point located on the plane defined by said surface of said disk target.

2. The sputtering target according to claim 1, wherein said arbitrary point is located on said surface of said disk target.

3. The sputtering target according to claim 1, wherein said arbitrary point is located on said plane defined by said surface of said disk target, but is not located on said surface of said disk target.

4. The sputtering target according to claim 1, wherein said arbitrary point is located at a center of said surface of said disk target.

5. The sputtering target according to claim 1, wherein said sputtering target has a relative density of 95% or higher.

6. The sputtering target according to claim 1, wherein a maximum surface roughness $R_{max}$ due to said grooves is 5 μm or less.

7. The sputtering target according to claim 1, wherein said grooves on said surface form a pattern intersecting at only one arbitrary point located on said surface of said disk target.

8. The sputtering target according to claim 1, wherein said grooves on said surface form a pattern intersecting at only two arbitrary points located on said surface of said disk target.

9. The sputtering target according to claim 1, wherein said grooves on said surface form a radial pattern.

10. The sputtering target according to claim 1, wherein said grooves are scratches resulting from grinding.

11. A method for preparing a sputtering target, the method comprising grinding a surface of a disk target comprising a sintered material, which is selected from the group consisting of a compound oxide of Ba and Ti, a compound oxide of Sr and Ti, and a compound oxide of Ba, Sr and Ti, to obtain a disk target having a surface which defines a plane and has been subjected to grinding and has grooves resulting from said grinding, wherein said grooves form a pattern intersecting at an arbitrary point located on the plane defined by said surface of said disk target; and forming the sputtering target of claim 1.

12. The method of claim 11, wherein said arbitrary point is located on said surface of said disk target.

13. The method according to claim 11, wherein said arbitrary point is located on said plane defined by said surface of said disk target, but is not located on said surface of said disk target.

14. The method according to claim 11, wherein said arbitrary point is located at a center of said disk target.

15. The method according to claim 11, wherein said sputtering target has a relative density of 95% or higher.

16. The method according to claim 11, wherein a maximum surface roughness $R_{max}$ due to said grooves is 5 μm or less.

17. The method according to claim 11, wherein said grinding is carried out by slowly rotating said disk target on a grinding table, while a horizontally rotatable straight cup wheel is contacted with the disk target such that said horizontally rotatable straight cup wheel contacts the center portion of said disk target.

18. A method for preparing a DRAM, the method comprising sputtering a ferroelectric film on a substrate, wherein said sputtering is carried out with the sputtering target of claim 1.

19. The method according to claim 18, wherein said arbitrary point is located on said surface of said disk target.

20. The method according to claim 18, wherein said arbitrary point is located on said plane defined by said surface of said disk target, but is not located on said surface of said disk target.

21. The method according to claim 18, wherein said arbitrary point is located at a center of said surface of said disk target.

22. The method according to claim 18, wherein said sputtering target has a relative density of 95% or higher.

23. The method according to claim 18, wherein a maximum surface roughness $R_{max}$ due to said grooves is 5 μm or less.

* * * * *